(12) United States Patent
Kim et al.

(10) Patent No.: US 8,460,990 B2
(45) Date of Patent: Jun. 11, 2013

(54) CMOS TRANSISTOR USING GERMANIUM CONDENSATION AND METHOD OF FABRICATING THE SAME

(75) Inventors: Jun-youn Kim, Suwon-si (KR); Joong S. Jeon, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/462,396

(22) Filed: May 2, 2012

(65) Prior Publication Data

US 2012/0214282 A1    Aug. 23, 2012

Related U.S. Application Data

(62) Division of application No. 12/230,936, filed on Sep. 8, 2008, now abandoned.

(30) Foreign Application Priority Data

Apr. 18, 2008    (KR) .......................... 10-2008-0036282

(51) Int. Cl.
*H01L 21/8238*    (2006.01)

(52) U.S. Cl.
USPC ........... 438/199; 438/154; 438/188; 438/300; 257/204; 257/369; 257/E21.634

(58) Field of Classification Search
USPC ................. 257/E21.632, E27.064, E27.108, 257/E21.634, E21.633, E27.062, E21.611, 257/E21.619, 202, 274, 52, 63, 204, 616, 257/511, 369, 19, 353, 354, 758, 72, 347, 257/69, 59; 438/FOR. 216, FOR. 187, 778, 438/782, 154, 156, 309, 322, 313, 188, 157, 438/149, 199, 197, 212, 300, 299, 202, 203, 438/205, 206

See application file for complete search history.

(56) References Cited

U.S. PATENT DOCUMENTS

| | | | |
|---|---|---|---|
| 5,545,571 A * | 8/1996 | Yamazaki et al. | 438/151 |
| 6,396,147 B1 * | 5/2002 | Adachi et al. | 257/758 |
| 6,507,069 B1 * | 1/2003 | Zhang et al. | 257/336 |
| 2006/0290828 A1 * | 12/2006 | Hwang et al. | 349/43 |
| 2007/0057347 A1 | 3/2007 | Ikeda | |
| 2008/0044958 A1 * | 2/2008 | Hwang | 438/154 |
| 2008/0283923 A1 * | 11/2008 | Li et al. | 257/365 |
| 2008/0290370 A1 | 11/2008 | Han et al. | |

* cited by examiner

*Primary Examiner* — Thanh Y Tran
(74) *Attorney, Agent, or Firm* — Harness, Dickey & Pierce, P.L.C.

(57) ABSTRACT

Provided is a CMOS transistor formed using Ge condensation and a method of fabricating the same. The CMOS transistor may include an insulating layer, a silicon layer on the insulating layer and including a p-MOS transistor region and an n-MOS transistor region, a first gate insulating layer and a first gate on a channel region of the p-MOS transistor region, and a second gate insulating layer and a second gate on a channel region of the n-MOS transistor region, wherein a source region and a drain region of the p-MOS transistor region may be tensile-strained due to Ge condensation, and the channel region of the n-MOS transistor region may be tensile-strained due to the Ge condensation.

11 Claims, 4 Drawing Sheets

CMOS TRANSISTOR USING GERMANIUM CONDENSATION AND METHOD OF FABRICATING THE SAME

CROSS-REFERENCE TO RELATED APPLICATIONS

This nonprovisional application is a divisional of, and claims priority under 35 U.S.C. §120 to, U.S. application Ser. No. 12/230,936, filed on Sep. 8, 2008 now abandoned, which claims priority under U.S.C. §119 to Korean Patent Application No. 10-2008-0036282, filed on Apr. 18, 2008, in the Korean Intellectual Property Office (KIPO), the entire contents of each of the above-mentioned applications are incorporated herein by reference.

BACKGROUND

1. Field

Example embodiments relate to a method of fabricating a complementary metal-oxide-semiconductor (CMOS) transistor using germanium condensation and a CMOS transistor formed from the same, and more particularly, to a method of fabricating a p-MOS transistor and an n-MOS transistor by simultaneously condensing germanium (Ge) in a p-MOS region and an n-MOS region and a CMOS transistor formed from the same.

2. Description of the Related Art

A major approach for increasing an operating speed of silicon based semiconductor devices is scaling down thereof. However, scaling down of semiconductor devices has reached limits, and heat emission caused by an increased number of devices is a problem. In order to address the heat emission problem, many studies on a higher mobility channel have been conducted.

A CMOS transistor may include a p-MOS transistor and an n-MOS transistor on a single substrate. In order to form the p-MOS transistor and the n-MOS transistor on a single substrate, a p-channel and an n-channel may be formed using materials different from each other. For example, the p-channel may be formed of strained Si and the n-channel may be formed of a Group III-V semiconductor. However, this method may include an epitaxial growing process, which is complicated and expensive.

SUMMARY

To address the above and/or other problems, example embodiments provide a method of readily fabricating a CMOS transistor by forming a p-channel and an n-channel separately on a silicon wafer using germanium condensation, and a CMOS transistor formed from the same.

According to example embodiments, a CMOS transistor may include an insulating layer, a silicon layer on the insulating layer and including a p-MOS transistor region and an n-MOS transistor region, a first gate insulating layer and a first gate on a channel region of the p-MOS transistor region, and a second gate insulating layer and a second gate on a channel region of the n-MOS transistor region, wherein a source region and a drain region of the p-MOS transistor region may be tensile-strained due to germanium (Ge) condensation, and the channel region of the n-MOS transistor region may be tensile-strained due to the germanium (Ge) condensation.

The channel region of the p-MOS transistor region may be compressive-strained. The length of the tensile-strained region may be extended by about 0.1 to about 2%. The channel region of the p-MOS transistor region may be a region in which germanium (Ge) may be condensed, and the channel region of the p-MOS transistor region may have a germanium (Ge) mole fraction smaller than those of the source region and the drain region of the p-MOS transistor region.

The first and second gate insulating layers may be formed of silicon oxide or a dielectric material having a dielectric constant greater than that of the silicon oxide. The first and second gates may be formed of polysilicon or a metal. The p-MOS transistor and the n-MOS transistor may have a fin structure, a trigate structure, an omega gate structure, or a gate-all-around structure.

According to example embodiments, a method of fabricating a CMOS transistor using germanium (Ge) condensation may include providing a substrate having an insulating layer and a silicon layer on the insulating layer, patterning the silicon layer into a p-MOS transistor region and an n-MOS transistor region, forming a mask layer on the substrate using a dielectric material to cover the p-MOS transistor region and the n-MOS transistor region, exposing a source region and a drain region of the p-MOS transistor region and a channel region of the n-MOS transistor region through the mask layer, coating a SiGe layer on the substrate to cover the source region and the drain region of the p-MOS transistor region and the channel region of the n-MOS transistor region, and condensing Ge of the SiGe layer in the source region and the drain region of the p-MOS transistor region and the channel region of the n-MOS transistor region by oxidizing the SiGe layer.

The channel region of the p-MOS transistor region may be relatively compressive-strained compared to the source region and the drain region of the p-MOS transistor region, and the channel region of the n-MOS transistor region may be tensile-strained. The dielectric material used to form the mask layer may be silicon nitride. The SiGe layer may be coated using a sputtering method or a chemical vapor deposition (CVD) method. The condensation of Ge of the SiGe layer may extend a length of the corresponding silicon layer where the condensation of Ge may be performed, by about 0.1 to about 2%. Patterning the p-MOS transistor region may further include coating a second SiGe layer on the p-MOS transistor region, and condensing Ge of the second SiGe layer in the source region, the drain region, and the channel region of the p-MOS transistor region by oxidizing the second SiGe layer.

Oxidizing the second SiGe layer may include annealing the substrate in a furnace at a temperature of about 800 to about 950° C. for about a few minutes to about one hour while supplying oxygen into the furnace. The p-MOS transistor and the n-MOS transistor may have a fin structure, a trigate structure, an omega gate structure, or a gate-all-around structure.

BRIEF DESCRIPTION OF THE DRAWINGS

Example embodiments will be more clearly understood from the following detailed description taken in conjunction with the accompanying drawings. FIGS. 1-4B represent non-limiting, example embodiments as described herein.

FIG. 1 is a cross-sectional view of a CMOS transistor according to example embodiments;

FIG. 3 is a graph showing a germanium (Ge) mole fraction in an n-MOS transistor region; and FIGS. 4A through 4B are cross-sectional views for explaining a method of fabricating a CMOS transistor according to example embodiments.

Figure 1:
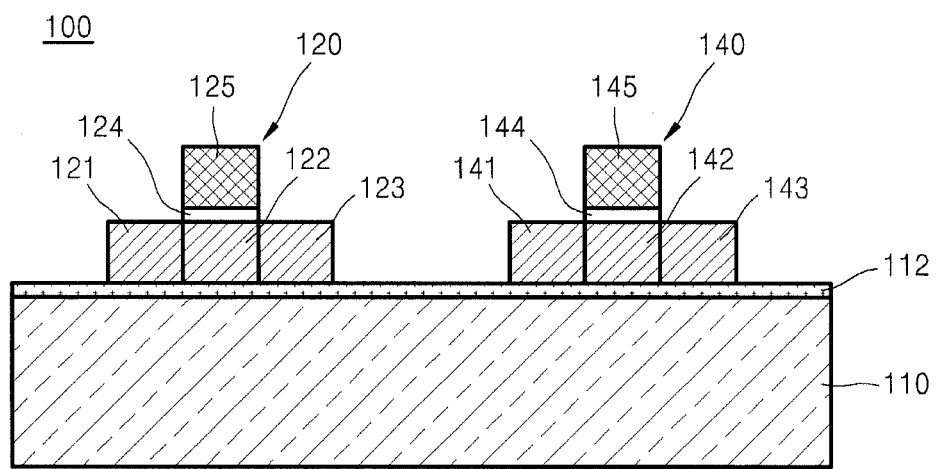

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

A CMOS transistor and a method of fabricating the CMOS transistor using germanium condensation according to example embodiments will now be described more fully with reference to the accompanying drawings in which example embodiments are shown. In the drawings, the thicknesses of layers and regions are exaggerated for clarity. Like reference numerals in the drawings denote like elements throughout the description. Example embodiments may, however, be embodied in many different forms and should not be construed as being limited to the embodiments set forth herein; rather, these embodiments may be provided so that this disclosure will be thorough and complete, and will fully convey the concept of example embodiments to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional view of a CMOS transistor 100 according to example embodiments. Referring to FIG. 1, an insulating layer 112 may be formed on a silicon substrate 110. The insulating layer 112 may be a silicon oxide. A p-MOS transistor 120 and an n-MOS transistor 140 separated from the p-MOS transistor may be formed on the insulating layer 112. The p-MOS transistor 120 and the n-MOS transistor 140 may constitute a complementary metal-oxide-semiconductor (CMOS) transistor.

The p-MOS transistor 120 may include a p-channel 122, formed on the insulating layer 112, and a source 121 and a drain 123 formed on both sides of the p-channel 122. The source 121 and the drain 123 may be tensile-strained SiGe layers, and the p-channel 122 between the source 121 and the drain 123 may be a relatively compressive-strained Si layer. The holes in the compressive-strained Si layer may have higher mobility. The p-channel 122 may be compressed due to the expansion of the source 121 and the drain 123. The source 121 and the drain 123 may be expanded by condensing germanium (Ge), which has a lattice constant greater than the source 121 and the drain 123, which may be formed of silicon. The length of the source 121 and the drain 123 may be extended by about 0.1 to about 2%.

The n-MOS transistor 140 may include an n-channel 142, formed on the insulating layer 112, and a source 141 and a drain 143 formed on both sides of the n channel 142. The n-channel 142 may be a tensile-strained SiGe layer. The n-channel 142 may be extended compared to the source 141 and the drain 143. The length of the n-channel 142 may be extended by about 0.1 to about 2%. A first gate insulating layer 124 and a first gate 125 may be sequentially stacked on the p-channel 122. A second gate insulating layer 144 and a second gate 145 may be sequentially stacked on the n-channel 142.

The first and second gate insulating layers 124 and 144 may be formed of silicon oxide or a dielectric material having a dielectric constant greater than that of the silicon oxide. The first and second gates 125 and 145 may be formed of polysilicon or a metal. The p-MOS transistor 120 and the n-MOS transistor 140 may have a fin structure, a trigate structure, an omega gate structure, or a gate-all-around structure.

In example embodiments, the p-channel 122 of the p-MOS transistor 120 may also be a SiGe layer. The SiGe layer of the p-channel 122 of the p-MOS transistor 120 may be formed to have a Ge mole fraction smaller than the Ge mole fraction of the source 121 and the drain 123 of the p-MOS transistor 120. The p-channel 122 of the p-MOS transistor 120 may be formed of a SiGe material in order to increase the mobility of holes, and a difference in the Ge mole fraction may be due to the Ge condensation in source and drain regions to compressively-strain the p-channel 122 in a subsequent fabrication process.

Although not shown in FIG. 1, the p-MOS transistor 120 and the n-MOS transistor 140 may be separated by a device isolation region (not shown). A method of fabricating a CMOS transistor according to example embodiments will now be described with reference to the following drawings. FIGS. 2A-2D are cross-sectional views for explaining a method of fabricating a CMOS transistor according to example embodiments.

Figure 2A:
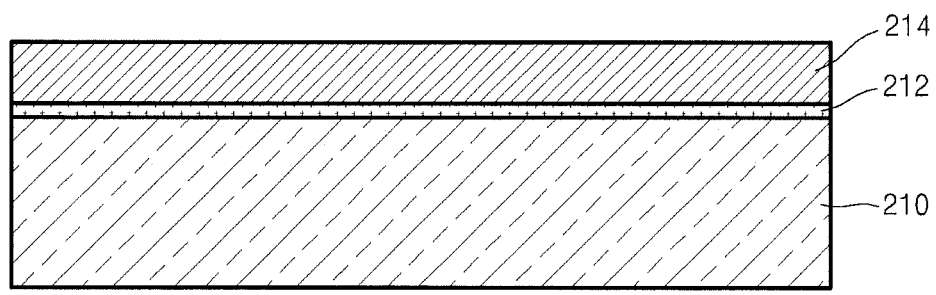
FIGS. 2A through 2D are cross-sectional views for explaining a method of fabricating a CMOS transistor according to example embodiments.
Figure 2B:
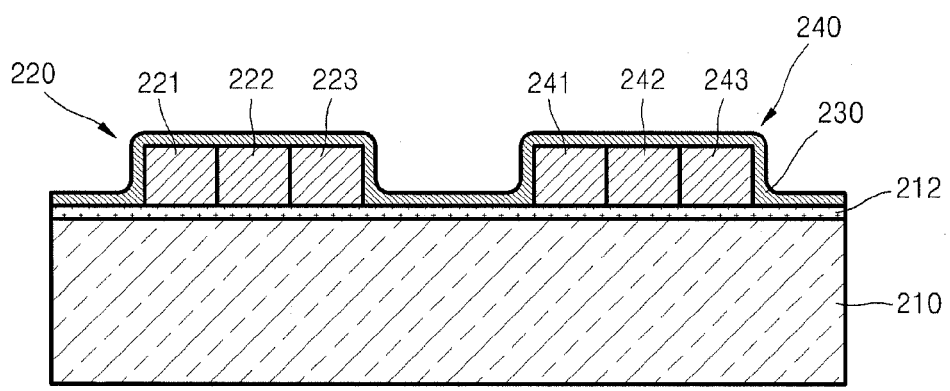
Figure 2C:
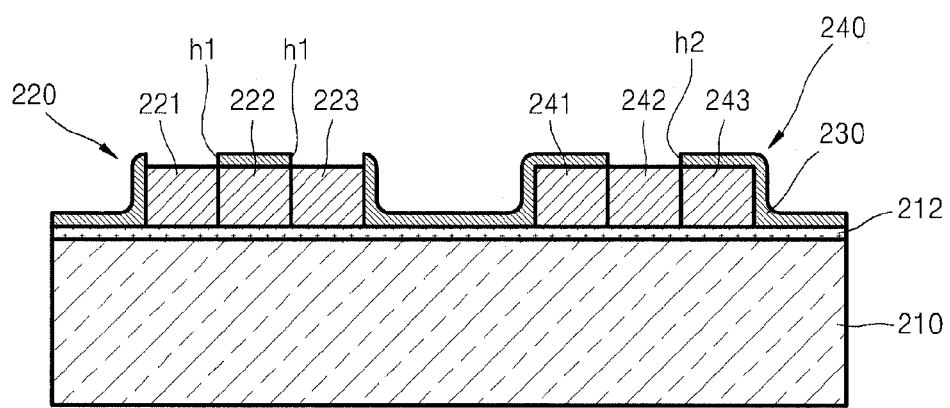

Referring to FIG. 2A, an insulating layer 212 may be formed on a silicon substrate 210, and a silicon layer 214 may be formed on the insulating layer 212. Thus, a silicon-on-insulator (SOI) substrate may be formed. Referring to FIG. 2B, a p-MOS transistor region 220 and an n-MOS transistor region 240 may be formed by patterning the silicon layer 214. A source region 221, a channel region 222, and a drain region 223 may be formed in the p-MOS transistor region 220, and a source region 241, a channel region 242, and a drain region 243 may be formed in the n-MOS transistor region 240. A mask layer 230 covering the p-MOS transistor region 220 and the n-MOS transistor region 240 may be formed using a dielectric material, for example, silicon nitride $Si_3N_4$. Referring to FIG. 2C, a first hole h1, which exposes the source region 221 and the drain region 223 of the p-MOS transistor region 220, and a second hole h2, which exposes the channel region 242 of the n-MOS transistor region 240, may be formed by patterning the mask layer 230.

Figure 2D:
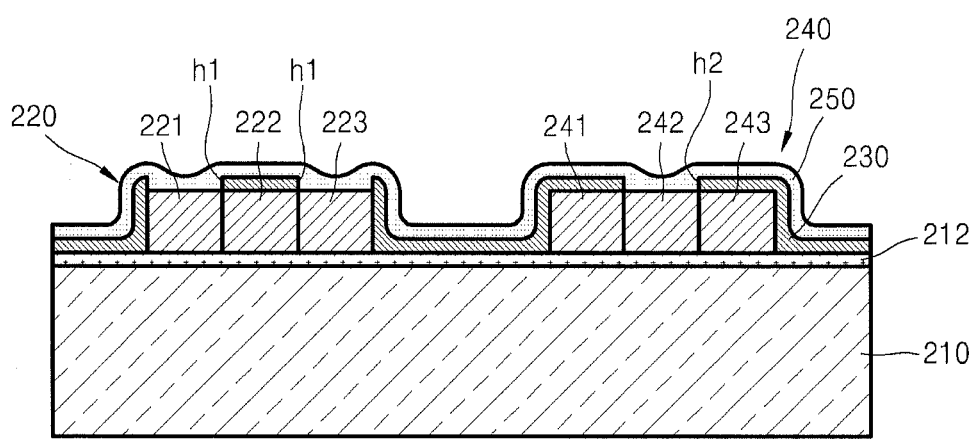

Referring to FIG. 2D, a SiGe layer 250 may be formed on the silicon substrate 210 using a sputtering method or a chemical vapour deposition (CVD) method. The SiGe layer 250 may be formed such that the SiGe layer 250 may contact the exposed source region 221 and the drain region 223 of the p-MOS transistor region 220 and the channel region 242 of the n-MOS transistor region 240.

The SiGe layer 250 may be oxidized using a dry oxidation method or a wet oxidation method. The oxidation of the SiGe layer 250 may be achieved by annealing the silicon substrate 210 in a furnace that may be maintained at a temperature of about 800 to about 950° C. for about a few minutes to about one hour while supplying oxygen into the furnace. The annealing condition may vary according to the thickness of the SiGe layer 250 and the Ge mole fraction in the SiGe layer 250. In the above oxidation process, Si of the SiGe layer 250 may be oxidized and Ge may move to the source region 221 and the drain region 223 of the p-MOS transistor region 220 and the channel region 242 of the n-MOS transistor region 240, which contacts the SiGe layer 250. The moved Ge may not be further diffused due to the insulating layer 212 under the SiGe layer 250, and thus, the Ge may condensate in the source region 221, the drain region 223, and the channel region 242.

The source region 221 and the drain region 223 of the p-MOS transistor region 220 may become a SiGe layer. Because Ge has a lattice constant greater than that of Si, the source region 221 and the drain region 223 of the p-MOS transistor region 220 may be tensile-strained, and thus, the channel region 222 between the source region 221 and the drain region 223 may be compressive-strained. The mobility of holes may be increased in the compressive-strained channel region 222. The channel region 242 of the n-MOS transistor region 240 may become a SiGe layer. The channel region 242 may be tensile-strained due to the condensation of Ge, and thus, the mobility of holes in the channel region 242 may be increased.

The concentration of Ge in the SiGe layer 250 and the thickness of the SiGe layer 250 may be controlled so that the source region 221 and the drain region 223 of the p-MOS transistor region 220 and the channel region 242 of the n-MOS transistor region 240 may have the Ge mole fraction to be extended about 0.1 to about 2% in a lengthwise direction of the channel.

A gate stack of the p-MOS transistor region 220 and a gate stack of the n-MOS transistor region 240 may be formed using a conventional CMOS fabrication process. Description of the conventional CMOS fabrication process to form the gate stack of the p-MOS transistor region 220 and the gate stack of the n-MOS transistor region 240 is omitted. Through the above process, the fabrication of the CMOS transistor 100 of FIG. 1 may be completed. The CMOS transistor 100 described above may have a fin structure, a trigate structure, an omega gate structure, or a gate-all-around structure. According to example embodiments, the channel regions 222 and 242 of the p-MOS transistor region 220 and the n-MOS transistor region 240 may be formed to have an optimum or improved mobility. For example, the channel region 222 of the p-MOS transistor region 220 and the channel region 242 of the n-MOS transistor region 240 may be formed in a single process. Also, the CMOS transistor 100 may be more readily formed without the need of an additional epitaxial process.

Figure 3:
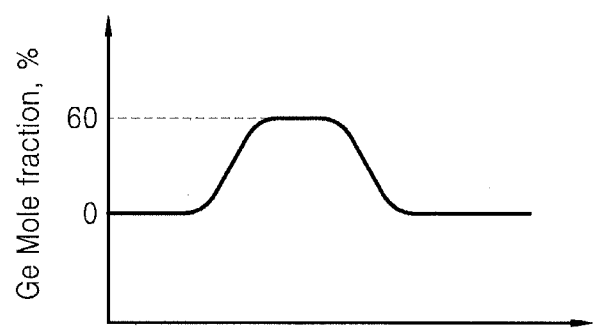

FIG. 3 is a graph showing a Ge mole fraction in an n-MOS transistor region. Referring to FIG. 3, Ge is not quite found in a source region and a drain region of the n-MOS transistor region, and the Ge mole fraction in a channel region may be about 60%. The gradient of the Ge mole fraction between the channel region and the source and drain regions may vary according to the size and the location of the second hole h2 of FIG. 2C. The Ge mole fraction in the p-MOS transistor region, for example, the Ge mole fraction in the source and drain regions, unlike in FIG. 3, may be higher and Ge may not be quite found in the channel region.

A method of fabricating a CMOS transistor according to example embodiments will now be described. Differences from the method of fabricating the CMOS transistor 100 will be described. Like reference numerals are used to indicate elements that are substantially identical to the elements of previous example embodiments, and thus, the detailed description thereof will not be repeated.

Figure 4A:
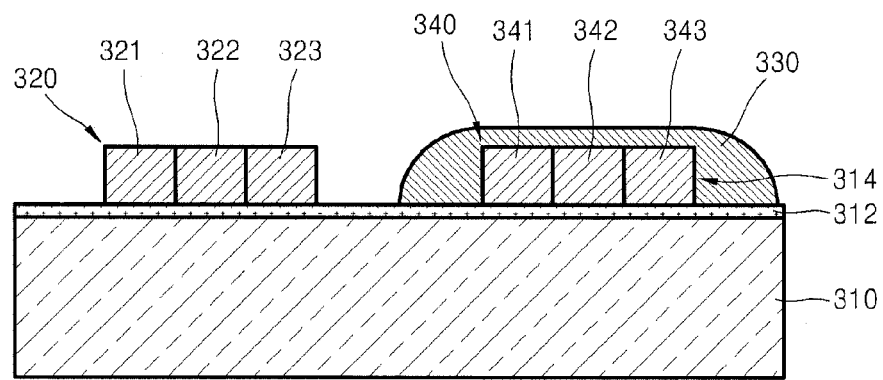
Figure 4B:
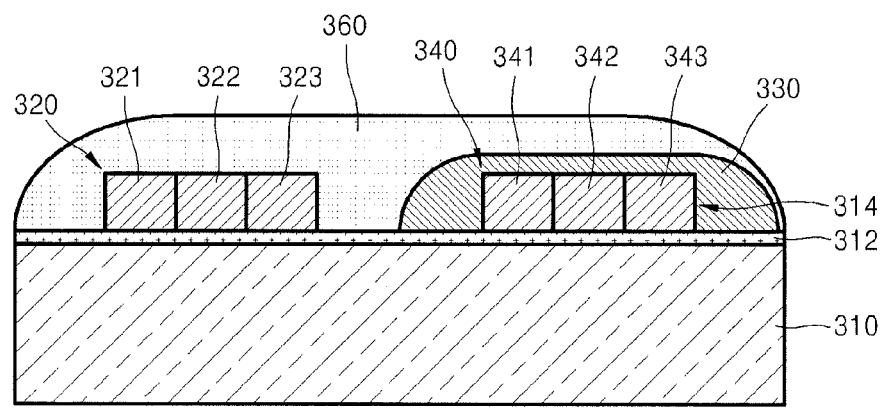

FIGS. 4A-4B are cross-sectional views for explaining a method of fabricating a CMOS transistor according to example embodiments. Referring to FIG. 4A, a SOI substrate having an insulating layer 312 formed on a Si substrate 310 and a silicon layer 314 on the insulating layer 312 may be prepared. A p-MOS transistor region 320 and an n-MOS transistor region 340 may be defined by patterning the silicon layer 314. A source region 321, a channel region 322, and a drain region 323 may be formed in the p-MOS transistor region 320. A source region 341, a channel region 342, and a drain region 343 may be formed in the n-MOS transistor region 340. A mask layer 330 covering the Si substrate 310, except for the p-MOS transistor region 320, may be formed using a dielectric material.

Referring to FIG. 4B, a SiGe layer 360 may be formed on the Si substrate 310 using a sputtering method or a CVD method. The SiGe layer 360 may be formed such that the SiGe layer 360 may contact the exposed p-MOS transistor region 320. The SiGe layer 360 may be oxidized using a dry oxidation method or a wet oxidation method. In the oxidation process, Si of the SiGe layer 360 may become a silicon oxide in the p-MOS transistor region 320, and Ge may move to the channel region 322, the source region 321, and the drain region 323 of the p-MOS transistor region 320. Thus, Ge may be condensed in the channel region 322, the source region 321, and the drain region 323. The Ge condensation may increase the mobility of holes in the p-MOS transistor.

The silicon oxide generated during the oxidation process may be removed, and a mask layer 230 (refer to FIG. 2B) may be formed on the Si substrate 310. Subsequent processes are substantially identical to the processes of previous example embodiments, and thus, the detailed description will not be repeated. According to example embodiments, the mobility of the p-MOS transistor may be optimized or improved.

In the above example embodiments, methods of simultaneously straining a channel region of a p-MOS transistor region and a channel region of an n-MOS transistor region may be described. However, example embodiments may not be limited thereto, for example, the degree of straining of each of the channel regions may be optimized or improved by differentiating the thicknesses of the SiGe layers or changing the ratio of Ge in the p-MOS transistor region and the n-MOS transistor region. Also, the SiGe layer in the p-MOS transistor region and the n-MOS transistor region may be sequentially formed.

While example embodiments have been particularly shown and described with reference to example embodiments thereof, it will be understood by one of ordinary skill in the art that various changes in form and details may be made therein without departing from the spirit and scope of the following claims.

What is claimed is:

1. A method of fabricating a CMOS transistor using Ge condensation, the method comprising:
    providing a substrate having an insulating layer and a silicon layer on the insulating layer;
    patterning the silicon layer into a p-MOS transistor region and an n-MOS transistor region;
    forming a mask layer on the substrate using a dielectric material to cover the p-MOS transistor region and the n-MOS transistor region;
    exposing a source region and a drain region of the p-MOS transistor region and a channel region of the n-MOS transistor region through the mask layer;
    coating a SiGe layer on the substrate to cover the source region and the drain region of the p-MOS transistor region and the channel region of the n-MOS transistor region; and
    condensing Ge of the SiGe layer in the source region and the drain region of the p-MOS transistor region and the channel region of the n-MOS transistor region by oxidizing the SiGe layer.

2. The method of claim 1, wherein a channel region of the p-MOS transistor region has greater compressive-strain compared to the source region and the drain region of the p-MOS transistor region, and the channel region of the n-MOS transistor region is tensile-strained.

3. The method of claim 1, wherein the dielectric material is silicon nitride.

4. The method of claim 1, wherein coating the SiGe layer is performed using a sputtering method or a chemical vapor deposition method.

5. The method of claim 4, wherein the condensation of Ge of the SiGe layer in the silicon layer extends a length of the corresponding silicon layer where the condensation of Ge is performed, by about 0.1 to about 2%.

6. The method of claim 1, wherein patterning the silicon layer into the p-MOS transistor region further comprises:
    coating a second SiGe layer on the p-MOS transistor region; and
    condensing Ge of the second SiGe layer in the source region, the drain region, and the channel region of the p-MOS transistor region by oxidizing the second SiGe layer.

7. The method of claim 6, wherein oxidizing the second SiGe layer includes annealing the substrate in a furnace at a temperature of about 800 to about 950° C for about a few minutes to about one hour while supplying oxygen into the furnace.

8. The method of claim 1, wherein the p-MOS transistor and the n-MOS transistor have a fin structure, a trigate structure, an omega gate structure, or a gate-all-around structure.

9. The method of claim 1, wherein the source and drain regions of the p-MOS transistor, and the channel region of the n-MOS transistor are in one horizontal plane.

10. The method of claim 9, further comprising:
    forming a first gate insulating layer and a first gate on a channel region of the p-MOS transistor region; and
    forming a second gate insulating layer and a second gate on the channel region of the n-MOS transistor.

11. The method of claim 1, wherein the source and drain regions of the p-MOS transistor, and the channel regions of the n-MOS transistor include equal thicknesses.

* * * * *